United States Patent
Kang et al.

(10) Patent No.: US 10,111,340 B2
(45) Date of Patent: Oct. 23, 2018

(54) METHOD OF MANUFACTURING A CONDUCTIVE SUBSTRATE

(71) Applicant: LG DISPLAY CO., LTD., Seoul (KR)

(72) Inventors: Minsoo Kang, Daejeon (KR); Hyunsik Park, Daejeon (KR); Young Kyun Moon, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 204 days.

(21) Appl. No.: 14/909,357

(22) PCT Filed: Aug. 18, 2014

(86) PCT No.: PCT/KR2014/007632
§ 371 (c)(1),
(2) Date: Feb. 1, 2016

(87) PCT Pub. No.: WO2015/023162
PCT Pub. Date: Feb. 19, 2015

(65) Prior Publication Data
US 2016/0174383 A1    Jun. 16, 2016

(30) Foreign Application Priority Data
Aug. 16, 2013  (KR) .................. 10-2013-0097410

(51) Int. Cl.
*H05K 3/12*     (2006.01)
*G06F 3/041*    (2006.01)
(Continued)

(52) U.S. Cl.
CPC .............. *H05K 3/12* (2013.01); *G06F 3/041* (2013.01); *H01L 51/445* (2013.01); *H05K 1/09* (2013.01);
(Continued)

(58) Field of Classification Search
CPC ..... H01L 21/88; H01L 21/306; H01L 51/445; H01L 2251/308; G06F 3/041; G06F 2203/04103; H05K 1/09; H05K 3/0017; H05K 2201/10128; H05K 3/12; Y02E 10/549; Y02P 70/521
See application file for complete search history.

(56) References Cited

U.S. PATENT DOCUMENTS

2003/0049918 A1  3/2003  Shen et al.
2005/0142974 A1  6/2005  Lee
(Continued)

FOREIGN PATENT DOCUMENTS

JP        60010646 A  * 1/1985
JP     2012-094348 A    5/2012
(Continued)

*Primary Examiner* — Carl Arbes
(74) *Attorney, Agent, or Firm* — Dentons US LLP

(57) ABSTRACT

Provided are a conducting substrate and a method for preparing the same. The method for preparing the conducting substrate according to an embodiment of the present application includes a) providing a substrate comprising a conducting layer; b) forming a metal layer on the entire surface of the substrate comprising the conducting layer; c) forming an insulating layer pattern on the metal layer; d) forming a metal layer pattern by over-etching the metal layer by using the insulating layer pattern as a mask; and e) reforming the insulating layer pattern.

8 Claims, 2 Drawing Sheets

(51) Int. Cl.
*H01L 51/44* (2006.01)
*H05K 1/09* (2006.01)
*H05K 3/00* (2006.01)

(52) U.S. Cl.
CPC . *H05K 3/0017* (2013.01); *G06F 2203/04103* (2013.01); *H01L 2251/308* (2013.01); *H05K 2201/10128* (2013.01); *Y02E 10/549* (2013.01); *Y02P 70/521* (2015.11)

(56) References Cited

U.S. PATENT DOCUMENTS

| | | | |
|---|---|---|---|
| 2011/0155443 A1* | 6/2011 | Maeda | H01L 21/4846 174/267 |
| 2011/0290548 A1 | 12/2011 | Hwang et al. | |
| 2012/0187821 A1 | 7/2012 | Lee et al. | |
| 2013/0221341 A1 | 8/2013 | Iwabuchi et al. | |

FOREIGN PATENT DOCUMENTS

| | | |
|---|---|---|
| KR | 10-2005-0005087 A | 1/2005 |
| KR | 10-0656510 B1 | 12/2006 |
| WO | 2011/008055 A2 | 1/2011 |
| WO | 2012-005540 A2 | 1/2012 |

\* cited by examiner

[Figure 1]
1) Deposition ITO
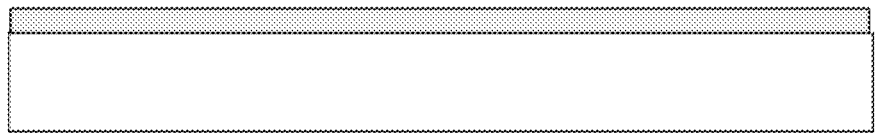
2) Patterning ITO
3) Deposition Metal layer
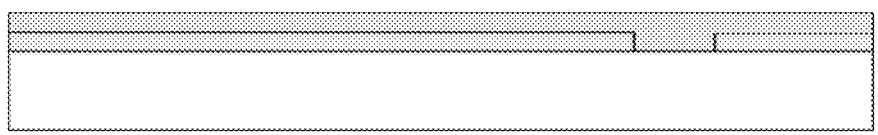
4) Printing Insulating layer pattern
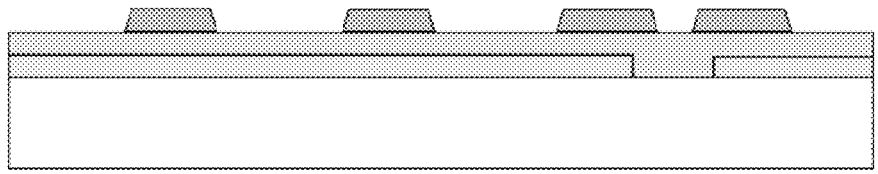
5) Over-etching Metal layer
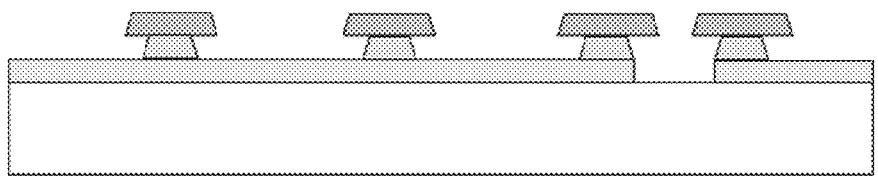
6) Reforming Insulating layer pattern
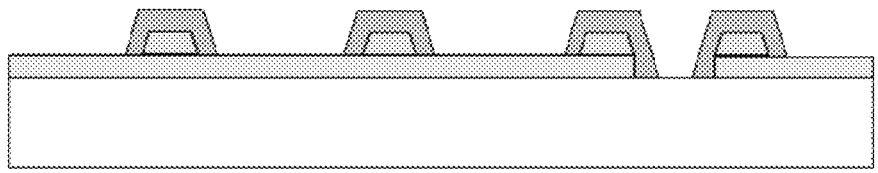

[Figure 2]
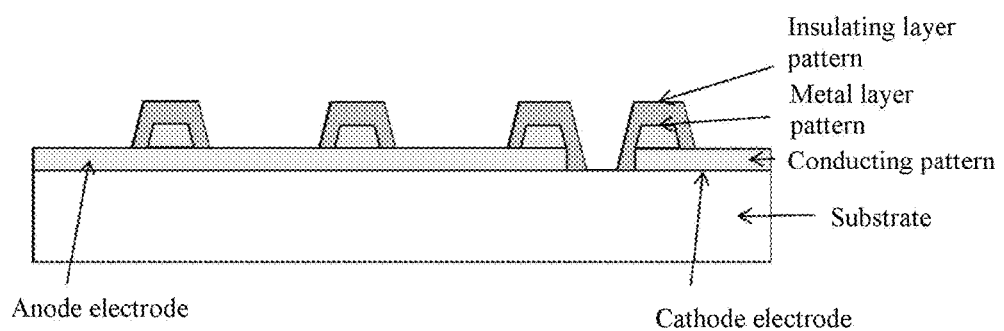

METHOD OF MANUFACTURING A CONDUCTIVE SUBSTRATE

TECHNICAL FIELD

This application is a National Phase entry of PCT/KR2014/007632 filed on Aug. 18, 2014 and claims priority to Korean Application No. 10-2013-0097410 filed in the Korean Intellectual Property Office on Aug. 16, 2013, both of which are incorporated by reference for all purposes as if fully set forth herein.

The present application relates to a conducting substrate and a method for preparing the same.

BACKGROUND ART

In the related art, in an anode electrode of an organic light emitting device, an organic solar cell, or the like, ITO is basically used as a main electrode, and an auxiliary electrode made of metal is mainly used in order to prevent a loss of light efficiency and the like due to high resistance of ITO.

In a method of forming the auxiliary electrode, the auxiliary electrode is formed by depositing and patterning ITO on a substrate, depositing and patterning a metal on the ITO, and then coating and patterning an insulating material on the metal. However, since a plurality of patterning processes is required in the method, the process is complicated and equipment investment cost is increased, and as a result, the above method is not a reasonable method.

Further, as the insulating material, polyimide is mainly used, but in order to pattern an insulating layer formed by coating the insulating material on the metal, polyimide has a characterisic of large light absorption. However, there is a problem in that transparency of polyimide having the large light absorption is insufficient.

DETAILED DESCRIPTION OF THE INVENTION

Technical Problem

An object of the present invention is to provide a method for preparing a conducting substrate and a conducting substrate prepared by the method, in which the number of processes is reduced and economic feasibility is largely improved, as compared with processes in the related art.

Technical Solution

An embodiment of the present application provides a method for preparing a conducting substrate including: a) providing a substrate comprising a conducting layer; b) forming a metal layer on the entire surface of the substrate comprising the conducting layer; c) forming an insulating layer pattern on the metal layer; d) forming a metal layer pattern by over-etching the metal layer by using the insulating layer pattern as a mask; and e) reforming the insulating layer pattern.

Another embodiment of the present application provides a conducting substrate including: a substrate; a conducting pattern formed on the substrate; a metal layer pattern formed on the conducting pattern; and an insulating layer pattern covering the metal layer pattern.

Advantageous Effects

According to the embodiment of the present application, a separate photoresist material and a separate stripping solution for forming the metal layer pattern provided on the conducting pattern are not used, and as a result, there is no problem of an increase in cost and environmental pollution and there is economics due to a simpler process than the existing photolithography process. Further, since a mask pattern used at the time of forming the metal layer pattern provided on the conducting pattern is not removed and the pattern is reformed to be used for insulating the metal layer pattern, the metal layer pattern which is not insulated by the insulating layer pattern is not present, and as a result, the foreign substrate does not remain, thereby preventing a short-circuit.

BRIEF DESCRIPTION OF DRAWINGS

FIG. 1 is a diagram schematically illustrating a method for preparing a conducting substrate according to an embodiment of the present application.

FIG. 2 is a diagram schematically illustrating a conducting substrate according to another embodiment of the present application.

BEST MODE

Hereinafter, the present application will be described in more detail.

A method for preparing a conducting substrate according to an embodiment of the present application includes a) providing a substrate comprising a conducting layer; b) forming a metal layer on the entire surface of the substrate comprising the conducting layer; c) forming an insulating layer pattern on the metal layer; d) forming a metal layer pattern by over-etching the metal layer by using the insulating layer pattern as a mask; and e) reforming the insulating layer pattern.

The method for preparing a conducting substrate according to an embodiment of the present application is exemplified in FIG. 1 below. However, the scope of the present application is not limited to FIG. 1, and additional processes may be added.

In the embodiment of the present application, step a) is a step of providing a substrate comprising a conducting layer. The conducting layer may be a patterned conducting layer. In addition, step a) may comprise forming the conducting layer on a substrate and patterning the conducting layer.

A material of the substrate may be properly selected depending on a field to which the method of preparing the conducting substrate according to the present application is applied, and as a preferable example, glass, an inorganic material substrate, a plastic substrate, other flexible substrates, and the like are included, but the material is not limited thereto.

The conducting layer may include a transparent conducting oxide. Here, the transparent conducting oxide may be oxide including at least one selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al), and lanthanum (La).

A method of forming and patterning the conducting layer may use any one physical vapor deposition (PVD) method selected from a sputtering method, an E-beam evaporation method, a thermal evaporation method, a laser molecular beam epitaxy (L-MBE) method, and a pulsed laser deposition (PLD) method; any one chemical vapor deposition method selected from a thermal chemical vapor deposition method, a plasma-enhanced chemical vapor deposition (PECVD) method, a light chemical vapor deposition method, a laser chemical vapor deposition method, a metal-organic chemical vapor deposition (MOCVD) method, and a hydride vapor phase epitaxy (HVPE) method; an atomic layer deposition (ALD) method; a photolithography method; a laser, or the like.

In the embodiment of the present application, step b) is a step of forming a metal layer on the entire surface of the substrate comprising the conducting layer. In addition, step b) may comprise forming the metal layer on the entire surface of the substrate and the patterned conducting layer.

The metal layer is preferably a single layer or a multilayer including alloys of silver, aluminum, copper, neodymium, molybdenum, chromium, or an alloy thereof, but is not limited thereto.

The method of forming the metal layer is not particularly limited, and may use any one physical vapor deposition (PVD) method selected from a sputtering method, an E-beam evaporation method, a thermal evaporation method, a laser molecular beam epitaxy (L-MBE) method, and a pulsed laser deposition (PLD) method; any one chemical vapor deposition method selected from a thermal chemical vapor deposition method, a plasma-enhanced chemical vapor deposition (PECVD) method, a light chemical vapor deposition method, a laser chemical vapor deposition method, a metal-organic chemical vapor deposition (MOCVD) method, and a hydride vapor phase epitaxy (HVPE) method; or an atomic layer deposition (ALD) method.

In the embodiment of the present application, step c) is a step of forming the insulating layer pattern on the metal layer.

The method of forming the insulating layer pattern may use a printing method, a photolithography method, a photography method, a method using a mask, or laser transfer, for example, thermal transfer imaging, but is not limited thereto.

Particularly, the method of forming the insulating layer pattern is preferably the printing method, and the printing method may be performed by transferring and then firing a paste or an ink including the insulating material onto the substrate with the conducting layer in a desired pattern shape. The transfer method is not particularly limited, but a pattern is formed on a pattern transfer medium such as an intaglio or a screen, and a desired pattern may be transferred on the conducting layer by using the formed pattern. The method of forming the pattern shape on the pattern transfer medium may use methods which are known in the art.

The printing method is not particularly limited, and may use printing methods such as offset printing, reverse offset printing, screen printing, gravure printing, and the like. The offset printing may be performed by filling a paste in the intaglio where the pattern is engraved, primarily transferring the paste to a silicon rubber called a blanket, and then secondarily transferring the paste by contacting the blanket and the substrate with the conducting layer. The screen printing may be performed by positioning the paste on the screen having the pattern, and then directly positioning the paste on the substrate with the conducting layer through a hollow screen while pressing a squeegee. The gravure printing may be performed by winding a blanket engraved with a pattern on a roll, filling a paste in the pattern, and then transferring the paste to the substrate with the conducting layer. In the present application, the methods may be used alone or in combination. Further, other printing methods which are known to those skilled in the art may also be used.

In the case of a gravure offset printing method or a reverse offset printing method, since most of the ink or the paste is transferred onto the substrate with the conducting layer due to a release property of the blanket, a separate blanket cleaning process is not required. The intaglio may be prepared by precisely etching the substrate. The intaglio may be prepared by etching a metal plate, or prepared through optical patterning with a polymer resin.

After the insulating layer pattern is formed, a taper angle of the insulating layer pattern is preferably more than 0° and less than 90°, and more preferably 10° or more and 70° or less. Here, the taper angle means an angle between an end of the insulating layer pattern and a lower layer thereof, that is, the surface of the metal layer. The taper angle may be measured as an angle between a straight line having an average slope of tangents from an end point of the insulating layer pattern to a point of starting to make the upper surface of the insulating layer pattern smooth and the surface of the lower layer thereof.

When the taper angle of the insulating layer pattern is in the range, in step e), the reforming of the insulating layer pattern is easily performed, and the insulating layer pattern may sufficiently cover the metal layer pattern.

It is preferred that the insulating layer pattern is formed by using a material having acid resistance which does not react with an etchant used when the metal layer pattern is formed and sufficient adhesion with the conducting layer in addition to the insulating property. Particularly, the embodiment of the present application includes e) reforming the insulating layer pattern to cover the metal layer pattern, and in step e), when a method of reforming the insulating layer pattern by treatment of heat, a solvent, vapor (vapor of the solvent), or plasma is used, as the insulating layer material, a polymer material having mobility and acid resistance by the treatment of heat, a solvent, vapor (vapor of the solvent), plasma, or the like is preferably used, and a polymer material having a crosslinking property is more preferably used.

It is preferred that the material of the insulating layer pattern has an insulating property of a leakage current of 10-1 amp or less. The leakage current of the material of the insulating layer pattern may be 10-16 amp or more. The material of the insulating layer pattern may have acid resistance to the etchant of the metal layer used in the corresponding method, and for example, when the material contacts the etchant of the corresponding metal layer by an immersion or spray method, it is preferred that the material does not changed in shape for 10 minutes or more. Further, the material of the insulating layer pattern may have mobility under a processing condition for step e) to be described below.

As the material of the insulating layer pattern, it is preferred that a polymer material having a firing or curing property is used under a reforming condition of the insulating layer pattern to be described below. In the present application, as the insulating layer material, a UV curable resin as well as a thermosetting resin may be used. Since the UV curable resin may not use the solvent unlike the thermosetting resin, there is no problem according to solvent evaporation, and as a result, it is advantageous to form a fine pattern having a stable shape. In detail, an example of the material of the insulating layer pattern may use an imide-based polymer, a bisphenol-based polymer, an epoxy-based polymer, an acrylic polymer, an ester-based polymer, a novolac-based polymer, or a combination thereof. Among the polymers, the acrylic, imide-based, or novolac resin is preferable. Further, an example of the material of the insulating layer pattern may use a combination or a copolymer of two or more of an imide-based monomer, a bisphenol-based monomer, an epoxy-based monomer, an acrylic monomer, and an ester-based monomer, for example, an epoxidized acrylic resin or a copolymer of an epoxy-based monomer and an acrylic monomer.

In the case where the insulating layer pattern is formed by a printing method, a process margin may be increased by controlling the content of solids or properly selecting a solvent.

The content of the solids of a printing composition for forming the insulating layer pattern may be differently controlled depending on a kind of printing method or a thickness of the insulating layer pattern. For example, in the case of using the gravure printing method, the content of the solids of the insulating layer pattern composition may be 70 to 80 wt %. Further, in the case of forming an insulating layer pattern having a thickness of 100 nm to 10 μm, more preferably, 500 nm to 2 μm by using the reverse offset printing method, the content of the solids of the insulating layer pattern composition may be 10 to 25 wt %. However, the scope of the present application is not limited to the examples, and the content of the solids of the insulating layer pattern composition may be controlled by those skilled in the art according to other materials or process conditions.

As a solvent which may be added in the insulating layer pattern composition, a solvent which may be used in the art may be used, and a single solvent or a mixed solvent of two or more solvents may be used. For example, if the solvent is a blanket material used in the printing method, for example, a solvent which does not damage polydimethylsiloxane (PDMS), the solvent is not particularly limited. For example, propylene glycol methyl ether acetate (PGMEA), ethanol, propylene carbonate, butyl cellosolve, dimethyl acetamide (DMAc), methyl ethyl ketone (MEK), methyl isobutyl ketone (MIBK), and the like may be used.

The composition for forming the insulating layer pattern may further include an adhesion promoter, a surfactant, or the like.

Further, the thickness of the insulating layer pattern may be larger than the thickness of the metal layer pattern so that the insulating layer pattern sufficiently covers the metal layer pattern, but is not limited thereto. Further, a width of the insulating layer pattern may be properly selected by those skilled in the art depending on a field to which the method of the present application is applied, and is not particularly limited. For example, a width of the bottom of the insulating layer pattern may have a dimension which may cover both the upper surface and the side of the metal layer pattern.

In the embodiment of the present application, step d) is a step of forming the metal layer pattern by over-etching the metal layer by using the insulating layer pattern as the mask.

In step d), the forming of the metal layer pattern may be performed by etching the metal layer by using the insulating layer pattern as the mask.

The etching method may be wet etching using an etchant or dry etching using plasma or laser, but is not limited thereto.

In the case of using the wet etching, as an etchant, a nitric acid (HNO3) solution, a mixed acid solution of phosphoric acid/nitric acid/acetic acid, one or two or more of hydrogen peroxide, perchloric acid, hydrochloric acid, hydrofluoric acid, and oxalic acid or an aqueous solution thereof may be used. If necessary, additives and other elements for etching a desired metal layer may be added. However, the etchant is not limited to the aforementioned examples, and an etchant which is generally known as an etching solution of the corresponding metal layer may be used.

In step d), when the metal layer is etched, overetching is performed, and as a result, an undercut may be formed below an edge of the insulating layer pattern.

The term "undercut" means a shape that when a first layer is formed on the substrate, a second layer is formed thereon, and then only the first layer is selectively etched by using the second layer as a mask, the side of the first layer is excessively etched, and as a result, an area of the first layer is smaller than an area of the second layer. Here, the term "using the second layer as the mask" means that the second layer is not deformed or removed by etching, but left as it is.

In a general etching process, in the case of etching the first layer by using the second layer as the mask, it is implemented so that a pattern of the first layer has the same shape as a pattern of the second layer, and the undercut is prevented from being generated.

However, in the present application, it is preferred that when the conducting layer is etched so that the undercut is formed below the insulating layer pattern, the metal layer pattern may be sufficiently covered by the insulating layer pattern in step e). Further, in the case of etching the metal layer so that the undercut is formed, since the etching may be sufficiently performed, a foreign substance such as a residual metallic material is almost not left on the substrate where the metal layer pattern is not formed, and as a result, there is an advantage in that a problem such as generation of a short circuit is not generated in a final product.

In step d), when the undercut is generated, the width or the length of the insulating layer pattern is larger than the width or the length of the metal layer pattern, and in this case, a difference between the width or the length of the insulating layer pattern and the width or the length of the metal layer pattern is preferably larger than the thickness of the metal layer pattern, and more preferably two times or more larger than the thickness of the metal layer pattern. In this case, the reason is that the edge of the insulating layer pattern sinks by the reforming to sufficiently cover the metal layer pattern.

Further, when the undercut is generated, the taper angle of the metal layer pattern is preferably more than 0° and less than 90°, more preferably more than 0° and 45° or less, and much more preferably more than 0° and 30° or less. Here, the taper angle means an angle between an end of the metal layer pattern and a lower layer thereof, that is, the surface of the conducting layer. The taper angle may be measured as an angle between a straight line having an average slope of tangents from an end point of the metal layer pattern to a point of starting to make the upper surface of the metal layer pattern smooth and the surface of the lower layer thereof. In the case where the taper angle of the metal layer pattern is in the range, the edge of the insulating layer pattern is reformed to sufficiently cover the metal layer pattern. Unlike the related art, by using the method, the present application may provide a conducting substrate including a metal layer pattern of which the taper angle is small.

In step d), a thickness of a void generated between the conducting pattern and the insulating layer pattern covering the conducting pattern may be controlled depending on an etching time for forming the metal layer pattern. As the etching time is increased, in a subsequent step e), when the insulating layer pattern is reformed, the thickness of the void formed between the insulating layer pattern and the metal layer pattern may be increased. When the void is very large, the deformation of the insulating layer pattern around the void may occur during a secondary etching or cleaning process for removing the foreign substance.

In the embodiment of the present application, the etching time for forming the metal layer pattern may vary according to conditions such as a kind or a concentration of the etchant used when the metal layer pattern is formed, a kind of metal layer, and an etching temperature. For example, the etching time is a just-etching time to a time 2,000% longer than the just-etching time, preferably a time 1 to 1,000% longer than the just-etching time, more preferably a time 1 to 500% longer than the just-etching time, and much more preferably a time 5 to 100% longer than the just-etching time. Here, the just-etching time means a time taken to etch the pattern in the same shape as the mask.

The etching temperature for forming the metal layer pattern may also vary according to conditions such as a kind or a concentration of the etchant used when the metal layer pattern is formed, a kind of metal layer, and an etching temperature, and for example, the etching temperature may be room temperature to 80° C., and preferably 30 to 70° C.

The etching method may be a deep etching method, a spray method, or the like, and more preferably, the spray method for uniform etching.

In the case where the metal layer is a multilayer, an etchant for etching the multilayer at the same time and at almost the same speed may be used.

In the embodiment of the present application, step e) is a step of reforming the insulating layer pattern.

In the present application, the term "covering" means that the insulating layer pattern reflows while the shape thereof is changed to contact the side of the metal layer pattern and the substrate to thereby insulate the metal layer pattern from the outside. Further, in the present application, the term "reforming" means that the shape thereof is changed while the insulating layer pattern has mobility to cover the metal layer pattern therebelow, as a term defined in this specification.

In step e), the reforming may use a chemical phenomenon, in which mobility is provided to the insulating layer pattern by for example, heat, a solvent or vapor thereof (vapor of the solvent), plasma treatment, or the like and thus the insulting layer pattern is deformed, and then the insulating layer pattern is cured by additional treatment of heat or plasma or the removal of the solvent. Alternatively, the insulating layer pattern may be physically deformed by applying pressure to the insulating layer pattern.

It is more preferred that the reforming of the insulating layer pattern is performed by using heat or a solvent (or vapor of the solvent), and in this case, as described above, as the insulating layer material, it is preferred that a plastic or curable polymer material is used.

When the insulating layer pattern is reformed by using heat, a method is preferable, in which the insulating layer material has mobility by applying heat to sink to a space between the conducting layer and the insulating layer, and then when the heat is further applied, the material is cured and thus the mobility disappears. In this case, a heating temperature may be properly selected by those skilled in the art according to an insulating layer material. The heating condition may be controlled so that the insulating layer pattern has a desired crosslink degree, for example, 10 to 100%, and a desired insulating property, for example, a leakage current of 10-1 amp or less. For example, it is preferred that the insulating layer material is heated at a temperature of 120 to 350° C. to increase to 5 to 60° C. Further, heat treatment at the same temperature or duplicated heat treatment at different temperatures may be performed. As a detailed example, in the case of using an imide-based resin as the insulating layer pattern material, heat treatment may be performed at a temperature of 250 to 300° C. As another example, in the case of using a novolac-based resin as the insulating layer pattern material, heat treatment may be performed at a temperature of 120 to 140° C.

Further, in the case of reforming the insulating layer pattern by using a solvent or the vapor of the solvent, a reforming method is preferable, in which when the insulating layer pattern is exposed under a vapor (fume) atmosphere of the solvent (solvent annealing) and the solvent and the insulating material react to each other, the insulating layer material has mobility, and as a result, when the insulating layer pattern is deformed to contact the substrate and then heated at a predetermined temperature to dry the solvent to remove the solvent, the insulating layer material is cured and the mobility disappears. In this case, the solvent may be properly selected by those skilled in the art according to the insulating layer material, and selected from a solvent group in which the insulating layer material may be dissolved. For example, in the case of using the novolac-based resin as the insulating pattern material, IPA may be used as the solvent. Further, a drying temperature is properly near the boiling point of the selected solvent and preferably between room temperature and 300° C., but is not limited thereto.

Further, in the embodiment of the present application, at the end of the patterned conducting layer, at least a part of the insulating layer pattern may be formed to contact the substrate. That is, at the end of the patterned conducting layer, the insulating layer pattern may cover the side of the patterned conducting layer.

In the embodiment of the present application, during or after step c) of forming the insulating layer pattern, a soft-bake process may be performed. In detail, the soft-bake process may be performed after forming the insulating layer pattern on the metal layer during step c), or before forming the metal layer pattern in step d). The soft bake means that by providing adhesion between the insulating layer pattern and a layer adjacent thereto and simultaneously curing at least a part of the insulating layer pattern, the deformation of the insulating layer pattern in the soft bake process or a subsequent process is prevented and the reflowing shape of the insulating layer pattern may be stably formed in the reforming of the insulating layer pattern to be performed thereafter. A curing degree of the insulating layer pattern to be achieved by the soft bake process may be determined by those skilled in the art according to a material of the insulating layer pattern or a reforming condition performed thereafter, and for example, the curing degree may be in a range of 0 to 100%.

The condition of the soft bake process may be selected by those skilled in the art according to a material of the insulating layer pattern, a thickness of the insulating layer pattern, an etching condition used for forming the metal layer pattern, for example, a kind of etchant, an etching time, an etching temperature, and the like. When the soft bake temperature is very high, the crosslinking degree of the insulating layer pattern is very high, and as a result, the deformation, for example, curling deformation may occur.

As one example, in the case of forming the insulating layer pattern by the printing method by using a novolac-based polymer, the soft bake may be performed at 80 to 85° C. for 2 to 3 minutes. As another example, in the case of forming the insulating layer pattern by using an acrylic-based polymer, the soft bake may be performed at 170 to 190° C. for 5 to 15 minutes. As another example, in the case of forming the insulating layer pattern by using a photosensitive polyimide (PSPI) polymer, the soft bake may be performed at 110 to 150° C. for 1 to 15 minutes.

When the soft bake temperature is very low, it is difficult to achieve an effect by performing the soft bake, and when the soft bake temperature is very high, the edge of the insulating layer pattern is deformed to be lifted, and as a result, the deformation has a bad influence on reforming the insulating layer pattern to cover the metal layer pattern. The soft bake time is changed depending on the material or process condition and for example, the soft bake may be performed for about 2 to 3 minutes, but the present application is not limited thereto.

The embodiment of the present application may further include a cleaning step after the reforming of the insulating layer pattern in step e). In the cleaning step, the etchant used in step d) may be used. The cleaning step is performed to remove the foreign substance.

A schematic view according to the embodiment of the present application is illustrated in FIG. 1 given below. However, the scope of the present application is limited by FIG. 1 and processes except for at least one of the processes illustrated in FIG. 1 may be performed as necessary and an additional process may be performed as necessary.

Further, a conducting substrate according to the embodiment of the present application includes a substrate; a conducting pattern formed on the substrate; a metal layer pattern formed on the conducting pattern; and an insulating layer pattern covering the metal layer pattern.

In the conducting substrate according to the embodiment of the present application, since contents regarding the substrate, the conducting pattern, the metal layer pattern, the insulating layer pattern, and the like are the same as the aforementioned contents, a detailed description thereof will be omitted.

Further, in the embodiment of the present application, at least a part of the insulating layer pattern may contact the substrate, at the end of the conducting pattern. That is, at the end of the conducting pattern, the insulating layer pattern may cover the side of the conducting pattern.

The conducting substrate according to the embodiment of the present application may be used as an electronic device and an electrode of an organic light emitting diode lighting, but the present application is not limited thereto. Examples of the electronic device include a touch screen, a display, a semiconductor, and the like.

In particular, when the conducting substrate according to the embodiment of the present application is applied to the organic light emitting diode lighting, the conducting pattern of the conducting substrate may be used as an anode electrode of an organic light emitting diode and the metal layer pattern of the conducting substrate may be used as an auxiliary electrode of the anode electrode.

Further, in the embodiment of the present application, a display device including the conducting substrate is provided.

In the embodiment of the present application, a lighting apparatus including the conducting substrate is provided.

According to the embodiment of the present application, since a separate photoresist material and a separate stripping solution for forming the metal layer pattern provided on the conducting pattern are not used, there is no problem of an increase in cost and environmental pollution and there is economics due to a simpler process than the existing photolithography process. Further, since a mask pattern used at the time of forming the metal layer pattern provided on the conducting pattern is not removed and the pattern is reformed to be used for insulating the metal layer pattern, the metal layer pattern which is not insulated by the insulating layer pattern is not present, and as a result, the foreign substrate does not remain, thereby preventing a short-circuit.

The invention claimed is:

1. A method for preparing a conducting substrate, comprising:
   a) forming a conducting layer on a substrate and patterning the conducting layer;
   b) forming a metal layer on the entire surface of the substrate and the patterned conducting layer;
   c) forming an insulating layer pattern on the metal layer;
   d) forming a metal layer pattern by over-etching the metal layer by using the insulating layer pattern as a mask; and
   e) reforming the insulating layer pattern to cover the metal layer pattern,
   wherein, the insulating layer pattern has mobility, and
   in the step of reforming the insulating layer pattern, the shape of the insulating layer pattern changes, and the insulating layer pattern reflows while the shape thereof is changed to contact the side of the metal layer pattern to thereby insulate the metal layer pattern from the outside.

2. The method of claim 1, wherein the conducting layer comprises a transparent conducting oxide.

3. The method of claim 2, wherein the transparent conducting oxide is an oxide including one or more selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al), and lanthanum (La).

4. The method of claim 1, wherein the metal layer is a single layer or a multilayer including silver, aluminum, copper, neodymium, molybdenum, chromium, or an alloy thereof.

5. The method of claim 1, wherein the method of forming the insulating layer pattern uses a printing method, a photolithography method, a photography method, a method using a mask, or laser transfer.

6. The method of claim 1, wherein a taper angle of the insulating layer pattern is more than 0° and less than 90°, and
   the taper angle is an angle between an end of the insulating layer pattern and a surface of the metal layer.

7. The method of claim 1, wherein during an over-etching process of the metal layer, an undercut is formed below the edge of the insulating layer pattern.

8. The method of claim 1, wherein at the end of the patterned conducting layer, at least a part of the insulating layer pattern is formed to contact the substrate.

* * * * *